(12) United States Patent
Wang et al.

(10) Patent No.: US 9,267,982 B2
(45) Date of Patent: Feb. 23, 2016

(54) PROCESSING APPARATUS AND ION IMPLANTATION APPARATUS

(71) Applicant: TAIWAN SEMICONDUCTOR MANUFACTURING COMPANY, LTD., Hsinchu (TW)

(72) Inventors: Shao-Hua Wang, Hsinchu (TW); Ming-Te Chen, Hsinchu (TW); Sheng-Wei Lee, Hsinchu (TW)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 293 days.

(21) Appl. No.: 13/764,260

(22) Filed: Feb. 11, 2013

(65) Prior Publication Data

US 2014/0227453 A1    Aug. 14, 2014

(51) Int. Cl.
| | |
|---|---|
| H01J 37/00 | (2006.01) |
| G01R 31/26 | (2014.01) |
| H01J 37/30 | (2006.01) |
| H01J 37/317 | (2006.01) |

(52) U.S. Cl.
CPC ......... *G01R 31/2607* (2013.01); *H01J 37/3007* (2013.01); *H01J 37/3171* (2013.01); *H01J 2237/15* (2013.01); *H01J 2237/30472* (2013.01)

(58) Field of Classification Search
CPC ............. G01R 31/2607; H01J 37/3171; H01J 37/3007; H01J 2237/30472; H01J 2237/15
USPC ............................................ 250/492.1–492.3
See application file for complete search history.

(56) References Cited

U.S. PATENT DOCUMENTS

| | | | |
|---|---|---|---|
| 7,902,527 B2 * | 3/2011 | Chen et al. ............... | 250/492.21 |
| 2006/0243920 A1 | 11/2006 | Ray et al. | |
| 2009/0032726 A1 * | 2/2009 | Sieradzki et al. ............. | 250/400 |
| 2010/0308215 A1 | 12/2010 | Vanderberg et al. | |

FOREIGN PATENT DOCUMENTS

| | | |
|---|---|---|
| JP | 2-31125 | 2/1990 |
| TW | I222099 | 10/2004 |
| TW | 200814126 | 3/2008 |
| TW | 200823976 | 6/2008 |

OTHER PUBLICATIONS

Office Action dated Nov. 4, 2014 from corresponding No. TW 102147124.
Office Action dated Jan. 23, 2015 and English translation from corresponding No. KR 10-2013-0092477.

* cited by examiner

*Primary Examiner* — Michael Maskell
(74) *Attorney, Agent, or Firm* — Hauptman Ham, LLP

(57) ABSTRACT

A processing apparatus includes an end station configured to support thereon a workpiece, an ion beam generator and a scanning device. The ion beam generator is configured to generate an ion beam toward the end station. The scanning device is configured to scan the ion beam in a transverse scanning direction. The scanning device is configured to be disposed in a first path of the ion beam toward the end station and out of a second path of the ion beam toward the end station.

20 Claims, 8 Drawing Sheets

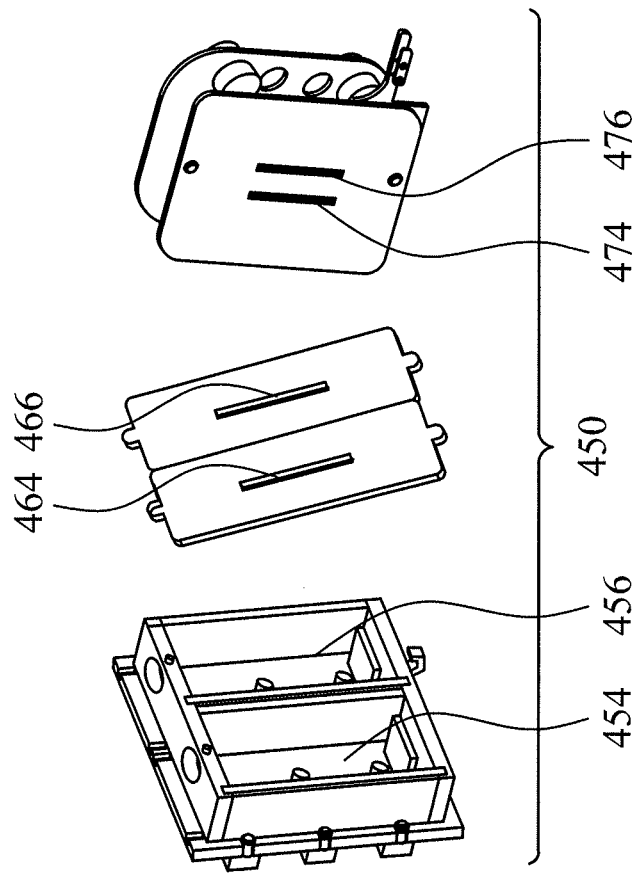
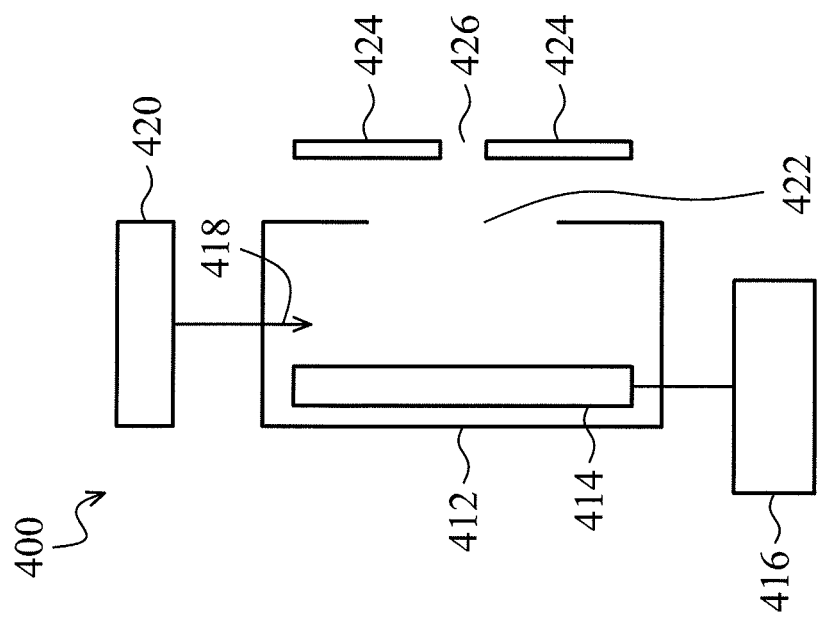
Fig. 4B
Fig. 4A

PROCESSING APPARATUS AND ION IMPLANTATION APPARATUS

BACKGROUND

Ion implantation is a technology widely used in semiconductor device manufacturing. In an ion implantation apparatus, an ion beam is generated and directed at a semiconductor wafer to implant ions therein, thereby forming ion implanted regions having desired conductivity. For different types of ion implanted regions, different ion beam properties, such as beam current and/or beam energy, are used. Various types of ion implantation apparatuses are developed to provide ion beams of different properties. Examples of such ion implantation apparatuses include medium current implanters (MCI), high current implanters (HCI), and high energy implanters (HEI). Ion implantation apparatuses of different types, e.g., MCI and HCI, are often provided as separate tools.

BRIEF DESCRIPTION OF THE DRAWINGS

One or more embodiments are illustrated by way of example, and not by limitation, in the figures of the accompanying drawings, wherein elements having the same reference numeral designations represent like elements throughout. The drawings are not to scale, unless otherwise disclosed.

FIG. 4A is a schematic cross-sectional side view of an ion source of an ion beam generator in accordance with some embodiments.

FIG. 4B is an exploded perspective view of an ion source of an ion beam generator in accordance with some embodiments.

DETAILED DESCRIPTION

Figure 1:
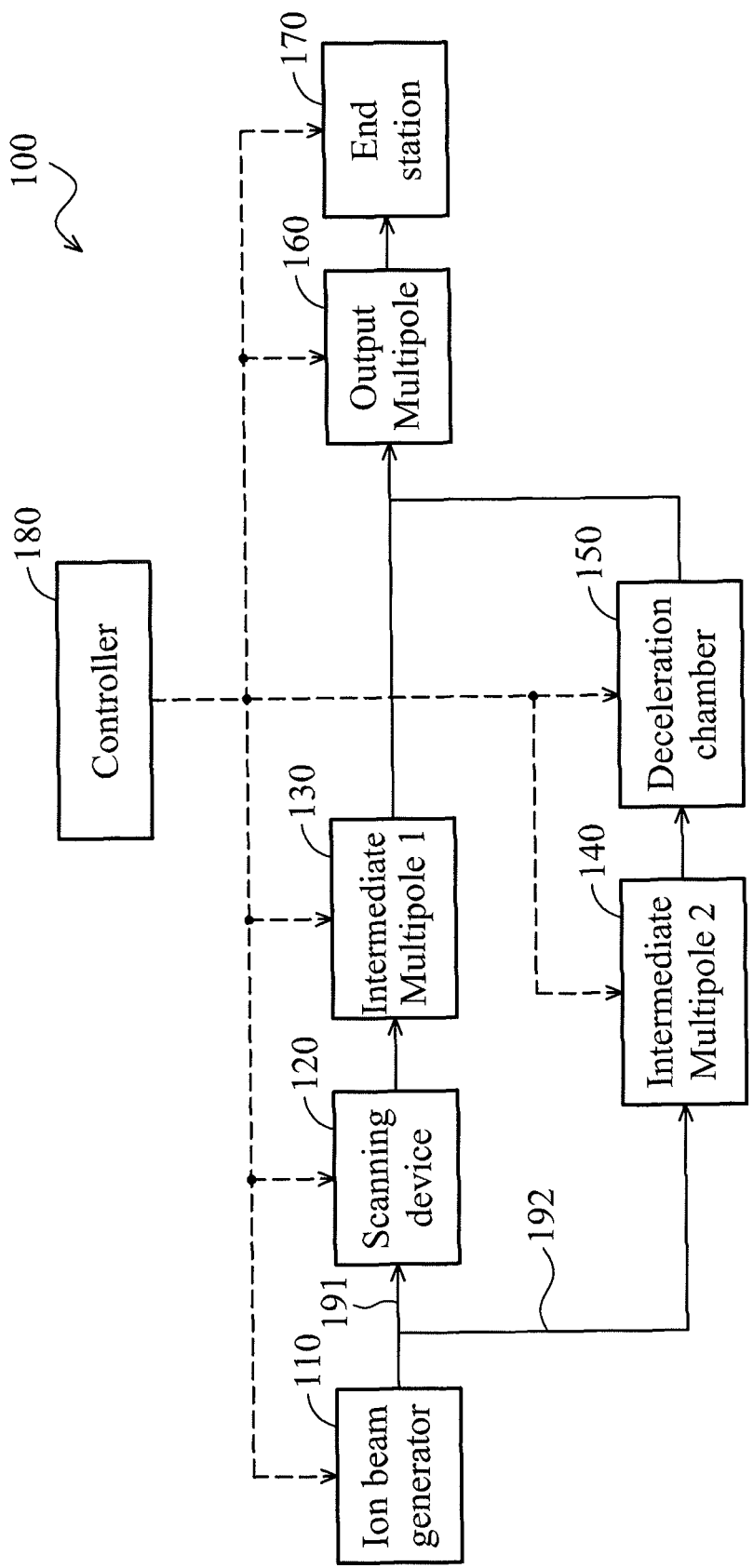
FIG. 1 is a schematic block diagram of a processing apparatus in accordance with some embodiments.

It is to be understood that the following disclosure provides many different embodiments or examples, for implementing different features of various embodiments. Specific examples of components and arrangements are described below to simplify the present disclosure. An inventive concept may; however, be embodied in many different forms and should not be construed as being limited to the embodiments set forth herein. It will be apparent; however, that one or more embodiments may be practiced without these specific details. Like reference numerals in the drawings denote like elements.

In a processing apparatus in accordance with some embodiments, ion beams having different configurations in accordance with various processing recipes are generated. An ion beam configuration is a set of ion beam properties including, but not limited to, beam current, beam energy and beam profile. Ion beams are further modified before impinging upon workpieces to be processed. For example, ion beams are modified to improve beam uniformity and/or to adjust a beam dimension. In some operation modes, ion beams having different configurations are modified differently due to the differences in ion beam configuration. One way to facilitate different modifications of ion beams having different configurations is to transmit ion beams having different configurations in different paths along which the ion beams are modified in accordance with the corresponding ion beam configurations. For example, an ion beam having a first configuration is transmitted along a first path, whereas an ion beam having a second, different configuration is transmitted along a second, different path toward the workpiece. The ion beam having the first configuration and transmitted along the first path is further scanned in a scanning direction transverse to the first path to adjust the beam dimension in the scanning direction. Thus, it is possible to provide and modify ion beams of various configurations in accordance with various processing recipes to be applied to different workpieces. In one or more embodiments, the ion beam having the first configuration is a medium current ion beam whereas the ion beam having the second configuration is a high current ion beam. Therefore, it is possible to provide a 2-in-1 processing apparatus which combines functionalities of an MCI with those of an HCI. As a result, one or more advantages such as reduced equipment footprint, reduced purchasing and/or maintenance cost, increased manufacturing throughput, etc., are achievable.

FIG. 1 is a schematic block diagram of a processing apparatus 100 in accordance with some embodiments. The processing apparatus 100 comprises an ion beam generator 110, a scanning device 120, a first intermediate multi-pole device 130, a second intermediate multi-pole device 140, a deceleration stage 150, an output multi-pole device 160, an end station 170 and a controller 180. The scanning device 120, the first intermediate multi-pole device 130 and the output multi-pole device 160 are arranged along a first path 191 between the ion beam generator 110 and the end station 170. The second intermediate multi-pole device 140, the deceleration stage 150 and the output multi-pole device 160 are arranged along a second path 192 between the ion beam generator 110 and the end station 170. The second path 192 is at least partially deviated from the first path 191.

The ion beam generator 110 is configured to generate an ion beam (not numbered in FIG. 1) having a first configuration or a second configuration. The second configuration is different from the first configuration in one or more ion beam properties, including, but not limited to,—beam current, beam energy and beam profile (i.e., a cross-section of the ion beam). The ion beam generator 110 transmits the ion beam having the first configuration along the first path 191, and the ion beam having the second configuration along the second path 192, toward the end station 170. In one or more embodiments, the ion beam generator 110 includes an ion source for generating ions and a beam guide assembly for guiding and collecting the generated ions into an ion beam. An ion source in accordance with some embodiments will be described with respect to FIGS. 4A-4B. A beam guide assembly in accordance with some embodiments will be described with respect to FIGS. 5A-5C.

The scanning device 120 is located downstream of the ion beam generator 110 on the first path 191 but not on the second path 192. The scanning device 120 is configured to scan the ion beam having the first configuration in a scanning direction transverse to the first path 191. In one or more embodiments, the scanning device 120 includes a pair of coils for generating between the coils an electromagnetic field that varies in time in accordance with a frequency of the power supplied to the pair of coils. As the ion beam is passed between the pair of coil, the time-varying electromagnetic field deflects the ions in the ion beam according to the left-hand rule or the right-hand rule. As a result, the whole ion beam is reciprocally deflected, i.e., scanned, in the scanning direction between the pair of coils. Additional details of the operation of the scanning device 120 in accordance with some embodiment will be described with respect to FIGS. 2-3 and 6. Other mechanisms for scanning ion beams are usable in some embodiments.

The first intermediate multi-pole device 130 is located downstream of the scanning device 120 on the first path 191. The first intermediate multi-pole device 130 is configured to control parallelism of the ion beam. In other words, the first intermediate multi-pole device 130 is configured to adjust trajectories of ions in the ion beam to be parallel, or as close as possible to being parallel, with the first path 191 along which the ion beam is transmitted. As a result, the ion beam outputted from the first intermediate multi-pole device 130 includes ions that travel in parallel or substantially parallel trajectories. Additional details of the operation of the first intermediate multi-pole device 130 in accordance with some embodiment will be described with respect to FIGS. 2 and 5C. In one or more embodiments, the first intermediate multi-pole device 130 is omitted from the processing apparatus 100.

The second intermediate multi-pole device 140 is located downstream of the ion beam generator 110 on the second path 192. Similar, to the first intermediate multi-pole device 130, the second intermediate multi-pole device 140 is configured to control parallelism of the ion beam along the second path 192. Additional details of the operation of the second intermediate multi-pole device 140 in accordance with some embodiment will be described with respect to FIGS. 3 and 5C. In one or more embodiments, the second intermediate multi-pole device 140 is omitted from the processing apparatus 100.

The deceleration stage 150 is located on the second path 192 downstream of the second intermediate multi-pole device 140. The deceleration stage 150 is configured to decelerate the ion beam before the ion beam reaches the workpiece at the end station 170. In one or more embodiments, the deceleration stage 150 includes one or more deceleration electrodes with positive potentials for decelerating positively charged ions in the ion beam. Further, the deceleration stage 150 is configured to deflect the ion beam on the second path 192 back to the first path 191. In one or more embodiments, the deceleration stage 150 is turned off in one or more operation modes. Additional details of the operation of the deceleration stage 150 in accordance with some embodiment will be described with respect to FIGS. 2-3.

The output multi-pole device 160 is common to both the first path 191 and the second path 192. On the first path 191, the output multi-pole device 160 is located downstream of the first intermediate multi-pole device 130. On the second path 192, the output multi-pole device 160 is located downstream of the deceleration stage 150. The output multi-pole device 160 is configured to control uniformity of the ion beam. In other words, the output multi-pole device 160 is configured to adjust the beam current and/or beam energy to be uniform, or as close as possible to being uniform, across the beam profile. As a result, the ion beam outputted from the output multi-pole device 160 is uniform, or substantially uniform, across the beam profile, thereby permitting a uniform dose of ions to be applied to a workpiece. Additional details of the operation of the output multi-pole device 160 in accordance with some embodiment will be described with respect to FIGS. 2-3 and 5C. In one or more embodiments, the output multi-pole device 160 is omitted from the processing apparatus 100.

The end station 170 is located at the end of the first path 191. The end station 170 is configured to support a workpiece thereon. In one or more embodiments, the workpiece is a semiconductor wafer. The end station 170 includes a chuck for holding the workpiece thereon, and an actuator for moving the chuck, with the workpiece held thereon, in one or more directions. The movements of the chuck is configured so that the ion beam impinges in a uniform manner on the workpiece. In some embodiments, the end station 170 further includes a load lock for transferring wafers into and out of the processing apparatus 100, and a robot arm for transferring wafers between the chuck and the load lock. In some embodiments, the end station 170 further includes a measuring device for measuring one or more properties of the ion beam to be impinging on the workpiece, thereby providing feedback information for adjusting the ion beam in accordance with a processing recipe to be applied to the workpiece. Examples of measured ion beam properties include, but are not limited to, beam profile, beam energy and beam current.

The controller 180 is coupled to the various components of the processing apparatus 100, i.e., the ion beam generator 110, the scanning device 120, the first intermediate multi-pole device 130, the second intermediate multi-pole device 140, the deceleration stage 150, the output multi-pole device 160 and the end station 170, for controlling operation of the various components. For example, the controller 180 controls the ion beam generator 110 to vary one or more ion beam properties, including, but not limited to, beam current, beam energy and beam profile. The controller 180 further controls parameters, e.g., the scanning frequency, of the scanning operation of the scanning device 120. The controller 180 also controls one or more of the parallelism tuning operation of the first intermediate multi-pole device 130 and the second intermediate multi-pole device 140, the ion beam decelerating operation of the deceleration stage 150, and the uniformity tuning operation of the output multi-pole device 160. The controller 180 is coupled to the end station 170 to control one or more of workpiece transfer and chuck movement. In one or more embodiments, the controller 180 is coupled to the measuring device provided in the end station 170 to receive the feedback information for adjusting operation of one or more of the other components of the processing apparatus 100. In some embodiments, the controller 180 is one or more computers or microprocessors programmed to perform one or more functions described herein. In some embodiments, the controller 180 is one or more microprocessor hard-wired to perform one or more functions described herein.

In some embodiments, the processing apparatus 100 is configured to perform ion implantation on a workpiece, such as a semiconductor wafer. Additionally, the processing apparatus 100 may be configured to perform other processing using ion beams, such as film deposition or surface treatment. Further, the processing apparatus 100 is configured to process not only wafers for semiconductor devices, but also other types of substrate, such as solar panels.

Figure 2:
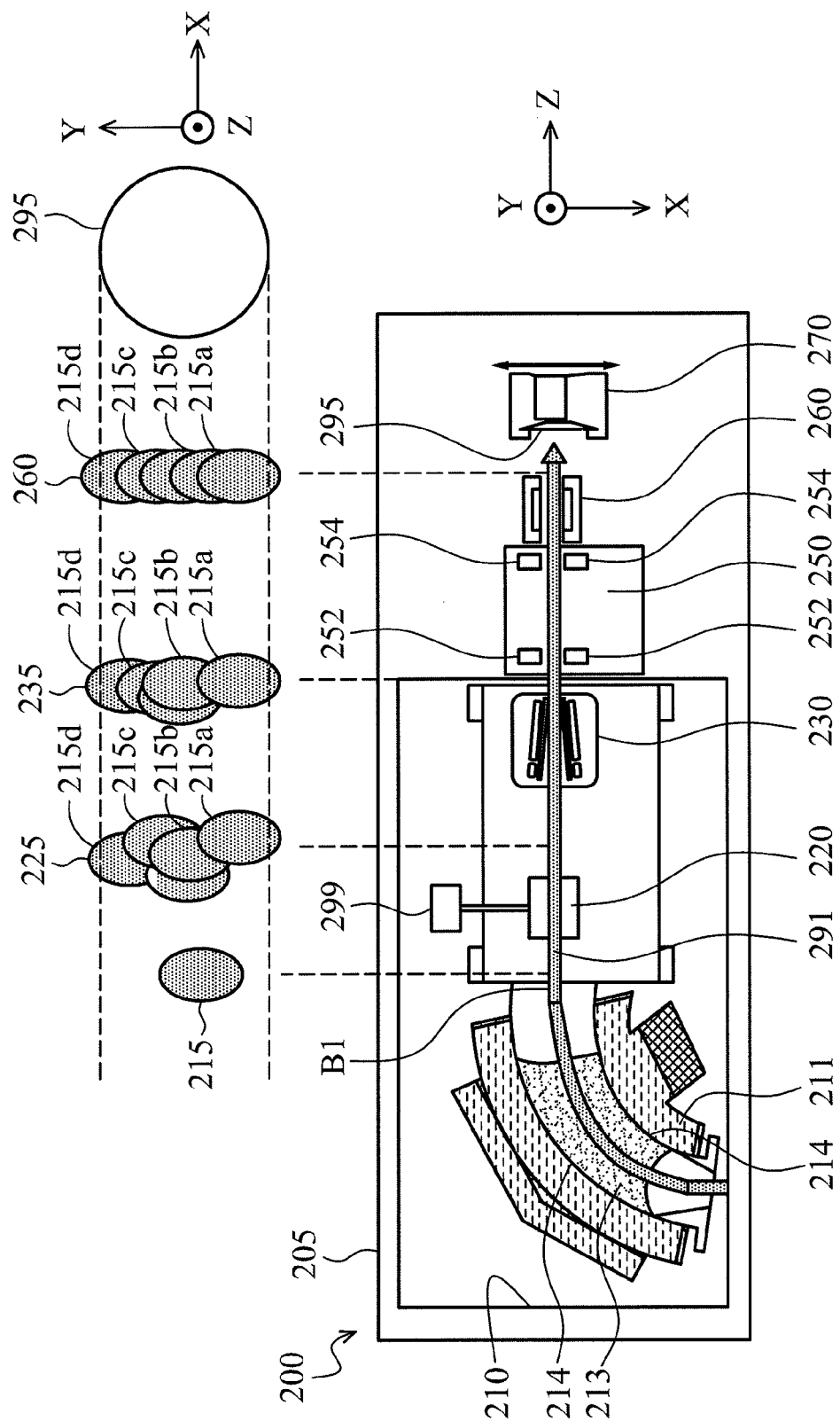
FIG. 2 is a schematic top view of an ion implantation apparatus in accordance with some embodiments in a first mode.
Figure 3:
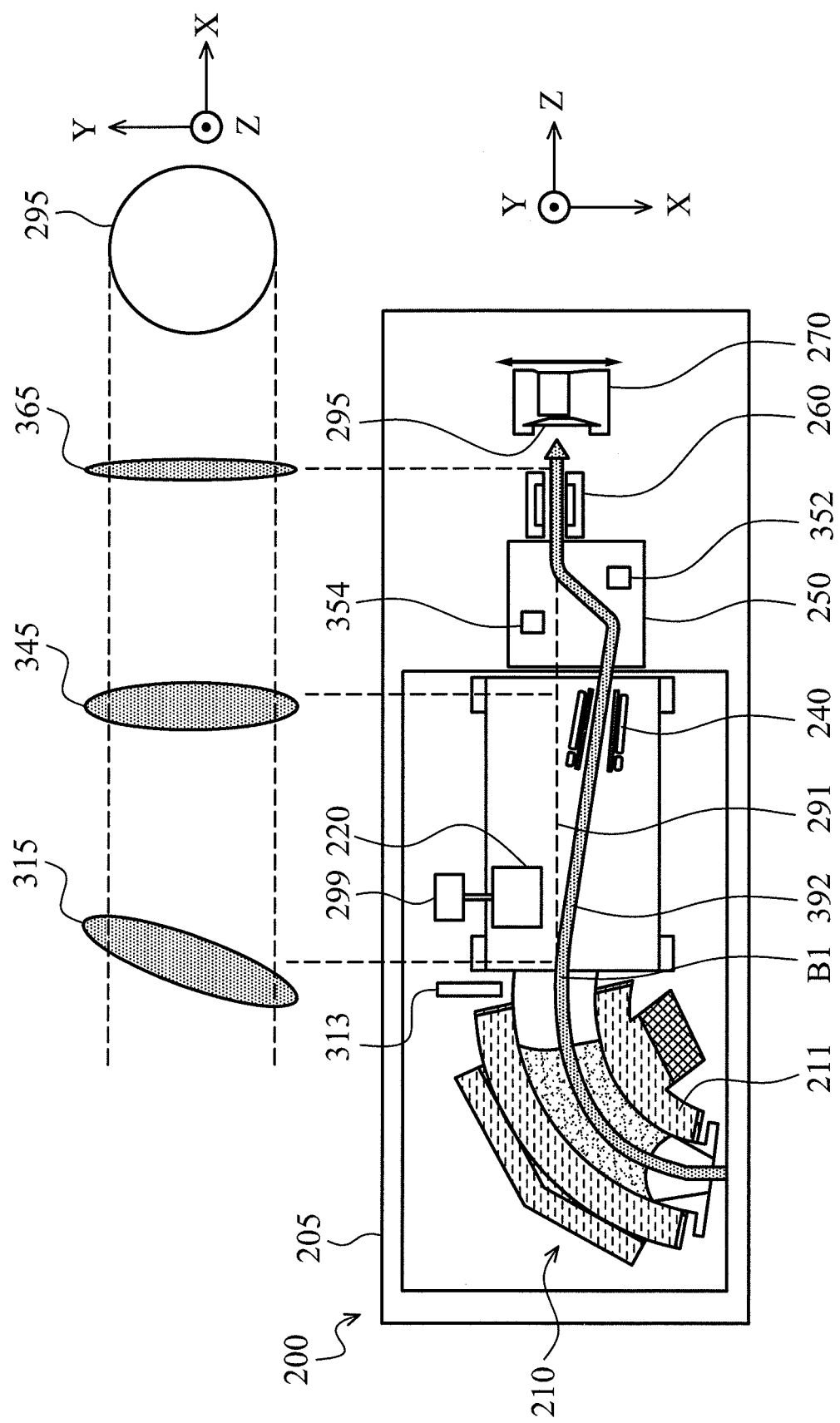
FIG. 3 is a schematic top view of the ion implantation apparatus of FIG. 2 in a second mode.

FIGS. 2 and 3 are schematic top views of an ion implantation apparatus 200 in accordance with some embodiments. FIG. 2 shows the ion implantation apparatus 200 in a first mode of operation. FIG. 3 shows the ion implantation apparatus 200 in a second mode of operation. The ion implantation apparatus 200 is an example of the processing apparatus 100 discussed with respect to FIG. 1. The ion implantation apparatus 200 includes vacuum chamber 205 configured to maintain a vacuum environment in which other components of the ion implantation apparatus 200 are contained. The ion implantation apparatus 200 further includes, in the vacuum chamber 205, an ion beam generator 210, a scanning device 220, a first intermediate multi-pole device 230, a second intermediate multi-pole device 240, a deceleration stage 250, an output multi-pole device 260 and an end station 270 similar to the corresponding ion beam generator 110, scanning device 120, first intermediate multi-pole device 130, second intermediate multi-pole device 140, deceleration stage 150, output multi-pole device 160 and end station 170 discussed with respect to the processing apparatus 100. The ion implantation apparatus 200 further includes a controller similar to the controller 180 discussed with respect to the processing apparatus 100. The ion implantation apparatus 200 also includes an actuator 299, e.g., a motor, for physically moving the scanning device 220 out of a path of an ion beam exiting from the ion beam generator 210 in one or more operation modes. In one or more embodiments, the actuator 299 is omitted from the ion implantation apparatus 200, and the ion beam exiting from the ion beam generator 210 is deflected to avoid the scanning device 220 in one or more operation modes. For simplicity, the second intermediate multi-pole device 240 is not illustrated in FIG. 2, and the first intermediate multi-pole device 230 is not illustrated in FIG. 3.

As seen in FIG. 2, the ion beam generator 210, scanning device 220, first intermediate multi-pole device 230, deceleration stage 250, output multi-pole device 260 and end station 270 are arranged along a first path 291 similar to the first path 191 discussed with respect to the processing apparatus 100. An X direction indicates a direction in which a workpiece 295 supported, e.g., by a chuck, at the end station 270 is reciprocally moved during an ion implantation process. A Y direction indicates a scanning direction of the scanning device 220. A Z direction indicates a direction in which the ion beam impinges on the workpiece 295. In some embodiments, the X, Y and Z directions are mutually perpendicular. In at least one embodiment, one or more of the X, Y and Z directions is/are not perpendicular to the other directions. The first path 291 in the specifically illustrated embodiment is a straight line extending in the Z direction. In at least one embodiment, the first path 291 is not linear.

The ion beam generator 210 is partially illustrated in FIG. 2 in the form of an analyzer magnet unit (AMU) 211. In some embodiments, one or more other components of the ion beam generator 210 is/are located downstream of the AMU 211 and upstream of the other components of the ion implantation apparatus 200. The AMU 211 has a curved internal passage 213 and one or more magnets (not numbered) arranged along the internal passage 213. An ion beam enters the internal passage 213 of the AMU 211 and is bent by the magnetic field of the magnets. As a result, ions in the ion beam that have a charge-to-mass ratio outside a predetermined range are deflected into side walls 214 of the internal passage 213. The AMU 211 allows the remaining ions in the ion beam which have the charge-to-mass ratio within a predetermined range to exit as an ion beam B1.

The ion beam B1 exiting from the AMU 211 along the first path 291 has a beam profile 215 which is a cross-section of the ion beam taken perpendicular to the first path 291. The beam profile 215 is a spot beam profile which has dimensions in both the X and Y directions smaller than the corresponding dimensions of the workpiece 295. If the ion beam with the beam profile 215 is impinged on the workpiece 295, the end station 270 will move the workpiece 295 in a two-direction (2D) scanning action in both the X direction and the Y direction to ensure that ion implantation is performed over the whole, or substantially the whole, surface of the workpiece 295. Such a 2D scanning action uses more time than a single-direction (1D) scanning action along the X direction.

The scanning device 220 is configured to scan the ion beam in a scanning direction, i.e., the direction Y, transverse to the direction Z of the first path 291. The scanned ion beam exiting from the scanning device 220 has a beam profile 225. The beam profile 225 is formed by a combination of a plurality of beam profiles 215, e.g., 215a-215d illustrated in FIG. 2, as the ion beam having the beam profile 215 is deflected by the scanning device 220 back and forth in the scanning direction Y. In one or more embodiments, a scanning frequency of the scanning device 220 is from 60 Hz to 999 Hz. The scanning action of the scanning device 220 increases the dimension of the beam profile 225 in the Y direction to be the same or greater than the corresponding dimension of the workpiece 295. Therefore, it is now sufficient for the end station 270 to move the workpiece 295 in a 1D scanning action along the X direction while still ensuring that ion implantation is performed over the whole, or substantially the whole, surface of the workpiece 295. Such a 1D scanning action uses less time than a 2D scanning action discussed above.

The first intermediate multi-pole device 230 is configured to control beam parallelism of the ion beam existing from the scanning device 220. The ion beam exiting from the first intermediate multi-pole device 230 has a beam profile 235 which has improved beam parallelism, e.g., along the Y direction, compared to that of the beam profile 225.

The ion beam with the beam profile 235 passes through the deceleration stage 250 in a straight line along the first path 291. In one or more embodiments, the controller of the ion implantation apparatus 200 deactivates the deceleration stage 250 so that the ion beam passes through the deceleration stage 250 without being decelerated. In one or more embodiments, the deceleration stage 250 is activated to decelerate the ion beam passing there through to decrease the beam energy in accordance with an ion implantation recipe to be applied to the workpiece 295. For example, a positive potential is applied to either, or both, of a pair of entry electrodes 252 at an entrance of the deceleration stage 250 and a pair of exit electrodes 254 at an exit of the deceleration stage 250. The positive potential has a decelerating effect on positively charged ions in the ion beam. In one or more embodiments, the deceleration stage 250 is configured to accelerate the ion beam passing there through to increase the beam energy in accordance with an ion implantation recipe to be applied to the workpiece 295. For example, a potential applied to the exit electrodes 254 is controlled to be more negative than a potential applied to the entry electrodes 252, thereby accelerating the ion beam toward the output multi-pole device 260. The beam profile 235 is unchanged, or substantially unchanged, by the deactivation, deceleration or acceleration in the deceleration stage 250.

The output multi-pole device 260 is configured to control beam uniformity of the ion beam existing from the deceleration stage 250. For example, the ion beam exiting from the output multi-pole device 260 has a beam profile 265 which has improved beam uniformity along the Y direction compared to that of the beam profile 235. The beam profile 265 has a dimension in the Y direction equal to or greater than the corresponding dimension of the workpiece 295. Therefore, it is sufficient for the end station 270 to perform a 1D scanning action along the X direction to ensure that the whole, or substantially the whole, surface of the workpiece 295 receives a uniform ion implantation.

In one or more embodiments, the first mode of operation described with respect to FIG. 2 is implemented to perform a medium current ion implantation with a beam current in the range from 1 µA to 800 µA. Such a medium current ion implantation is suitable for forming various features in semiconductor wafers, including, but not limited to, N-wells, P-wells, N-lightly doped source/drain (LLD) pockets, P-LLD pockets, electrostatic discharge (ESD) protection features, etc.

FIG. 3 shows the ion implantation apparatus 200 in the second mode of operation. In this second mode, an ion beam B2 having a second configuration different from the first configuration of the ion beam B1 is provided by the ion beam generator 210, e.g., at the exit of the AMU 211. The AMU 211 functions similarly to the first mode of operation described with respect to FIG. 2, except that at the exit of the AMU 211, the ion beam B2 is deflected to a second path 392 which is partially deviated from the first path 291 and along which the second intermediate multi-pole device 240, the deceleration stage 250 and the output multi-pole device 260 are arranged. In one or more embodiments, a deflecting electrode 313 is arranged at the exit of the AMU 211 and is supplied with a positive potential. The positive potential of the deflecting electrode 313 interacts with the positively charged ions in the ion beam and deflects the ion beam to the second path 392. Other ion beam deflecting mechanisms are usable in some embodiments.

The ion beam exiting from the AMU 211 along the second path 392 has a beam profile 315. The beam profile 315 is a ribbon beam profile which has a dimension in either the X direction or the Y direction greater than the corresponding dimension of the workpiece 295. In the specifically disclose embodiment, the beam profile 315 has a dimension in the Y direction greater than the corresponding dimension of the workpiece 295. If the ion beam with the beam profile 315 is impinged on the workpiece 295, it is sufficient for the end station 270 to perform a 1D scanning action to ensure that ion implantation is performed over the whole, or substantially the whole, surface of the workpiece 295.

Because the ion beam having the beam profile 315 is already suitable for a 1D scanning, the scanning device 220 is not used in the second mode of operation, in accordance with some embodiments. In at least one embodiment, the deflection of the ion beam from the first path 291 to the second path 392 is sufficient to place the scanning device 220 out of the second path 392. However, in at least one embodiment, the deflection of the ion beam to the second path 392 is insufficient for the ion beam to avoid colliding or other interfering with the scanning device 220. In such a situation, the scanning device 220 is physically moved away from the second path 392, for example, by the actuator 299 as shown in FIG. 3.

The second intermediate multi-pole device 240 is configured to control beam parallelism of the ion beam transmitted from the AMU 211 along the second path 392. In this aspect, the second intermediate multi-pole device 240 functions similarly to the first intermediate multi-pole device 230. The second intermediate multi-pole device 240 is further configured to adjust a vertical angle of the ion beam. The ion beam exiting from the second intermediate multi-pole device 240 has a beam profile 345 which has improved beam parallelism, e.g., along the Y direction, compared to that of the beam profile 315. Further, while the beam profile 315 has a long axis inclined with respect to the Y direction, the beam profile 345 has a long axis which is closer to the Y direction than the beam profile 315, i.e., the vertical angle of the ion beam has been improved by the second intermediate multi-pole device 240.

The ion beam with the beam profile 235 passes through the deceleration stage 250 which is configured to deflect the ion beam from the second path 392 back to the first path 291 before the ion beam reaches the output multi-pole device 260. In one or more embodiments, the deceleration stage 250 includes deflecting electrodes 352 and 354 which are supplied with positive potentials. The positive potential of the deflecting electrode 352 interacts with the positively charged ions in the ion beam and deflects the ion beam toward the deflecting electrode 354. The positive potential of the deflecting electrode 354 also interacts with the positively charged ions in the ion beam and deflects the ion beam toward the straight line of the first path 291. The positive potentials of the deflecting electrodes 352 and 354 also have decelerating effects on the positively charged ions in the ion beam. The ion beam transmitted along the bents section of the second path 392 in the deceleration stage 250 is decelerated to reduce the beam energy of the ion beam in accordance with an ion implantation recipe to be applied to the workpiece 295. In some embodiments, additional decelerating electrodes are arranged to further control the beam energy. Other ion beam deflecting and/or decelerating mechanisms are usable in some embodiments. The beam profile 345 is unchanged, or substantially unchanged, by the deceleration or deflection in the deceleration stage 250.

The output multi-pole device 260 is configured to control beam uniformity of the ion beam existing from the deceleration stage 250 similarly to the first mode of operation described with respect to FIG. 2. The ion beam exiting from the output multi-pole device 260 has a beam profile 365 which has improved beam uniformity along the Y direction compared to that of the beam profile 345. The beam profile 365 has a dimension in the Y direction equal to or greater than the corresponding dimension of the workpiece 295. Therefore, it is sufficient for the end station 270 to perform a 1D scanning action along the X direction to ensure that the whole, or substantially the whole, surface of the workpiece 295 receives a uniform ion implantation.

In one or more embodiments, the second mode of operation described with respect to FIG. 3 is implemented to perform a high current ion implantation with a beam current in the range from 800 µA to 35000 µA. Such a high current ion implantation is suitable for forming various features in semiconductor wafers, including, but not limited to, N-LLD regions, P-LLD regions, N-source/drain (S/D) regions, P-S/D regions, etc.

Accordingly, it is possible, in some embodiments, to provide a 2-in-1 ion implantation apparatus which functions as an MCI in the first mode of operation as described with respect to FIG. 2, and as an HCI in the second mode of operation as described with respect to FIG. 3. As a result one or more advantages such as reduced equipment footprint, reduced purchasing and/or maintenance cost, increased manufacturing throughput, etc., are achievable.

When the ion implantation apparatus 200 functions as an MCI in the first mode of operation in accordance with some embodiments, the ion beam B1 generated by the ion beam generator 210 has a lower beam current than the ion beam B2 generated by the ion beam generator 210 in the second mode of operation. By keeping the beam profile of the ion beam B1 small, e.g., as a spot beam profile, uniformity of the ion beam B1 is preserved. The scanning action of the scanning device 220 then converts the spot beam profile of the ion beam B1 to a ribbon-like beam profile, thereby permitting the end station 270 to perform a 1D scanning action which uses less time than a 2D scanning action that would be otherwise performed if the ion beam B1 with the spot beam profile was used directly for ion implantation. The first intermediate multi-pole device 230 and the output multi-pole device 260 further improve beam parallelism and beam uniformity before the scanned ion beam is used for ion implantation. In some embodiments, the beam energy is adjusted, e.g., accelerated, in accordance with the ion implantation recipe to be applied to the workpiece 295. As a result, a uniform, low current, high energy ion implantation is achievable with a 1D scanning action.

When the ion implantation apparatus 200 functions as an HCI in the second mode of operation in accordance with some embodiments, the ion beam B2 generated by the ion beam generator 210 has a higher beam current than the ion beam B1 generated by the ion beam generator 210 in the first mode of operation. As a result, it is possible to provide the ion beam B2 in a large beam profile, e.g., as a ribbon beam profile. The scanning action of the scanning device 220 is not performed in at least one embodiment. The second intermediate multi-pole device 240 and the output multi-pole device 260 further improve beam parallelism, beam vertical angle and beam uniformity before the ion beam is used for ion implantation. In some embodiments, the beam energy is adjusted, e.g., decelerated, in accordance with the ion implantation recipe to be applied to the workpiece 295. As a result, a uniform, high current, low energy ion implantation is achievable with a 1D scanning action.

FIG. 4A is a schematic cross-sectional side view of an ion source 400 which is a part of an ion beam generator usable as the ion beam generator 110 or the ion beam generator 210 in accordance with some embodiments. The ion source 400 includes an arc chamber 412 housing therein an electrode 414 which is connected to a power source 416. The arc chamber 412 has a port 418 connected to a working gas supply 420. The arc chamber 412 further includes an arc slit 422. The ion source 400 further includes an extraction electrode 424 having an extraction slit 426 that is disposed opposite the arc slit 422. In operation, a working gas of a dopant to be ionized is supply from the working gas supply 420 through the port 418 into the arc chamber 412. In addition, radio frequency (RF) or microwave power is supplied to the electrode 414 from the power source 416 to excite free electrons within the arc chamber 412. The excited electrons collide with the gas molecules to generate ions. The generated ions which are positively charged are extracted through the arc slit 422 and the extraction slit 426 by supplying a negative potential to the extraction electrode 424. The extracted ions are guided and collected into an ion beam as described with respect to FIGS. 5A-5C. By controlling various factors, such as excitation power, extraction power etc., it is possible to control a configuration of the generated ion beam to provide either an ion beam suitable for the first mode of operation of the ion implantation apparatus 200 or an ion beam suitable for the second mode of operation of the ion implantation apparatus 200.

FIG. 4B is an exploded perspective view of an alternative ion source 450 in accordance with some embodiments. The ion source 450 includes at least two arc chambers, and accordingly, at least two arc slits and at least two extraction slits. In the specifically disclosed embodiment in FIG. 4B, the ion source 450 is a dual ion source having two arc chambers 454, 456, two corresponding arc slits 464, 466 and two corresponding extraction slits 474, 476. Ion streams extracted from the extraction slits 474, 476 are merged into a single, common ion beam to be used for ion implantation.

The arc chamber 454 and the arc chamber 456 are configured to operate individually or together to vary at least one of beam current or beam energy of the common ion beam. For example, in at least one embodiment, the arc chamber 454 is configured to operate individually while the arc chamber 456 is turned off. The ion beam generated by the arc chamber 454 has a beam current in a range from 1 μA to 800 μA which is suitable, in at least one embodiment, as the ion beam B1 for used in the first mode of operation of the ion implantation apparatus 200. In at least one embodiment, both the arc chamber 454 and the arc chamber 456 are operated at the same time to generate together an ion beam having a beam current in a range from 800 μA to 35000 μA which is suitable, in at least one embodiment, as the ion beam B2 for used in the second mode of operation of the ion implantation apparatus 200. In at least one embodiment, the arc chamber 456 is operated individually while the arc chamber 454 is turned off to provide further flexibility in current beam and/or current energy adjustment.

Figure 5A:
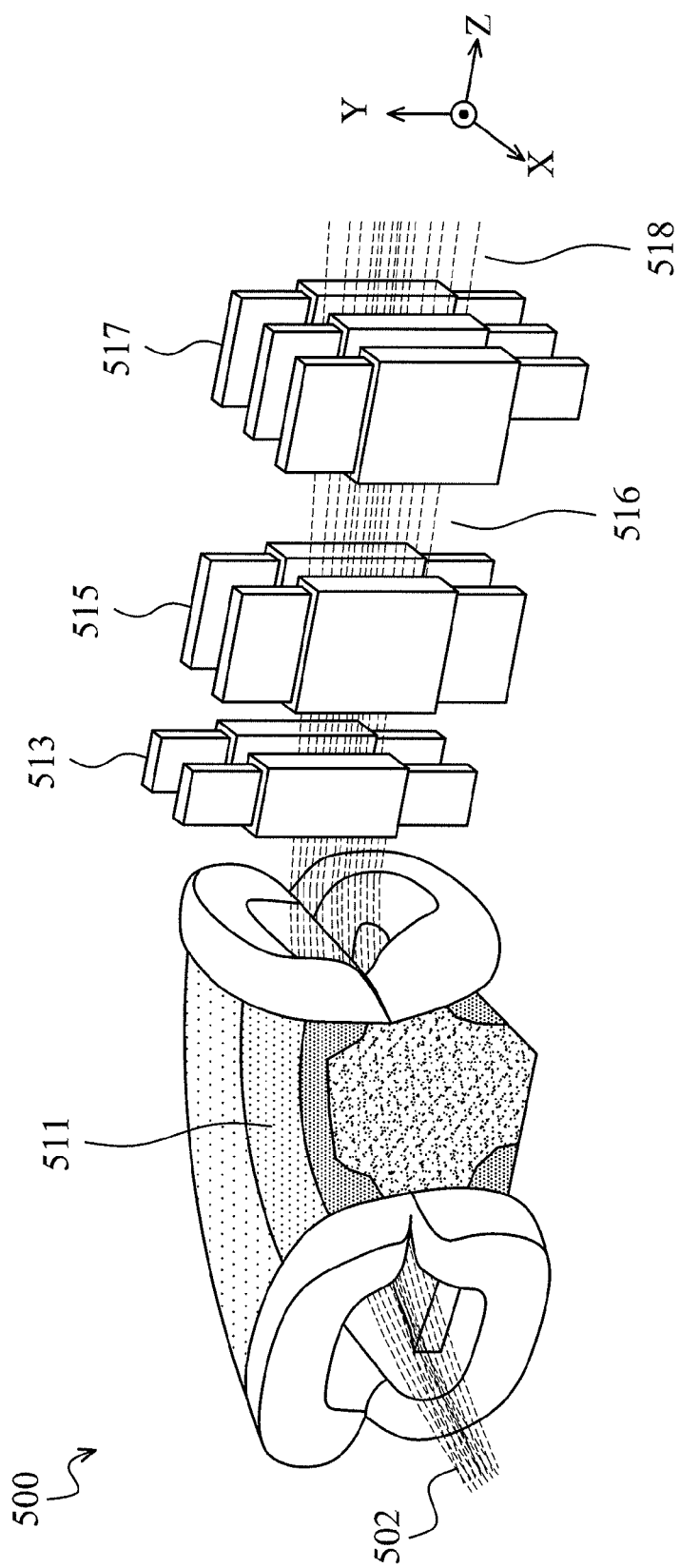
FIGS. 5A and 5B are perspective views of a beam guide assembly of an ion beam generator, in accordance with some embodiments, in different operation modes.
Figure 5B:
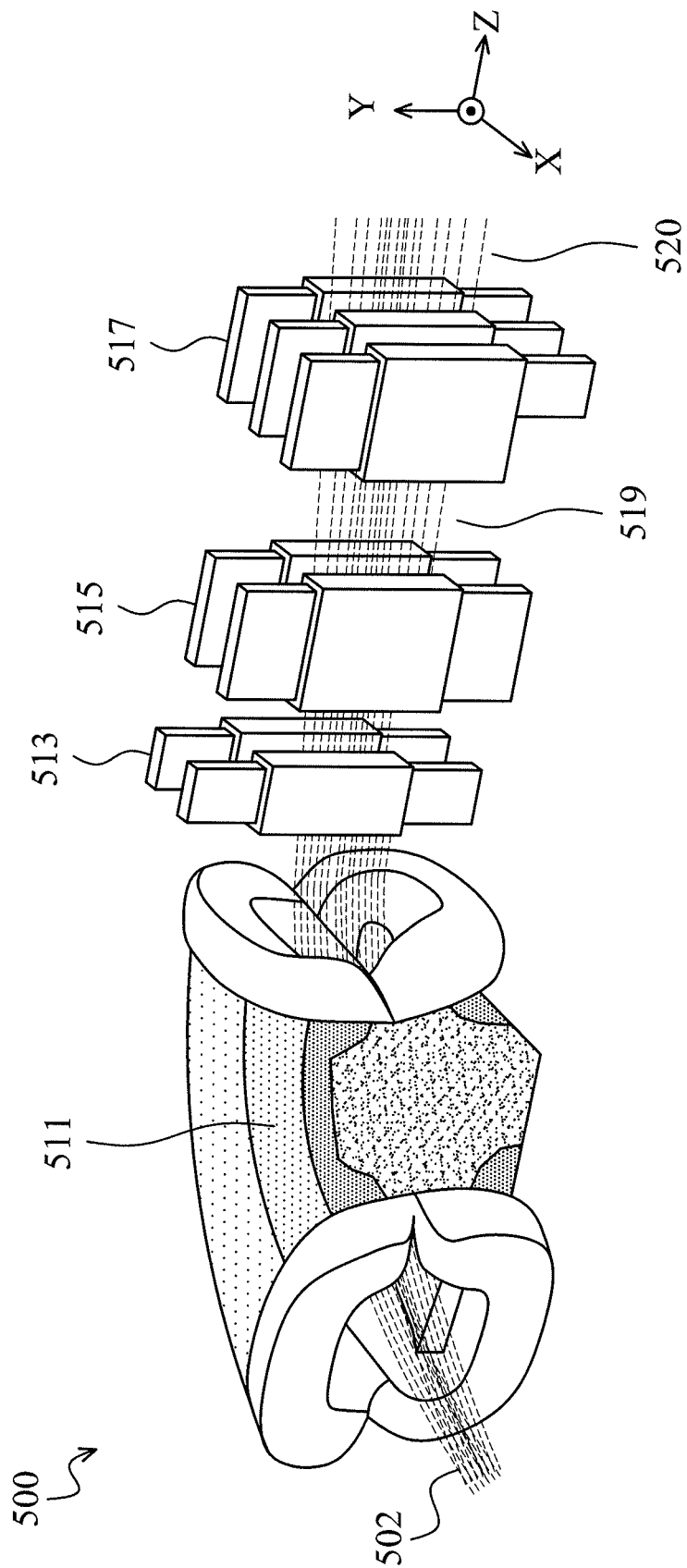

FIGS. 5A and 5B are perspective views of a beam guide assembly 500 which is another part of an ion beam generator usable as the ion beam generator 110 or the ion beam generator 210 in accordance with some embodiments. FIG. 5A shows the beam guide assembly 500 in a first mode corresponding to the first mode or operation of the ion implantation apparatus 200. FIG. 5B shows the beam guide assembly 500 in a second mode corresponding to the second mode or operation of the ion implantation apparatus 200.

The beam guide assembly 500 is positioned downstream of an ion source, such as the ion source 400 or ion source 450 described with respect to FIGS. 4A-4B, to collect and guide the extracted ion stream(s) into an ion beam. The beam guide assembly 500 includes an AMU 511 and at least one multi-pole device. In the specifically disclosed embodiment, the AMU 511 is similar to the AMU 211 described with respect to FIG. 2, and the beam guide assembly 500 includes a first multi-pole device 513, a second multi-pole device 515 downstream of the first multi-pole device 513, and a third multi-pole device 517 further downstream of the second multi-pole device 515. In some embodiments, one or more of the multi-pole devices 513, 515, 517 is/are omitted.

In some embodiments, the first multi-pole device 513 is configured as a linear multi-pole device to confine the ion beam exiting from the AMU 511 in the X direction between a pair of multi-pole electrodes of the first multi-pole device 513. The second multi-pole device 515 is configured as a lens to diverge or converge the ion beam in the Y direction, depending on the control voltages applied to multi-pole electrodes of the second multi-pole device 515. The third multi-pole device 517 is configured as a collimator to cause ions in the ion beam to travel in parallel to the Z direction.

In the first mode of the beam guide assembly 500 as illustrated in FIG. 5A, the second multi-pole device 515 is configured as a converging lens to converge the ion beam as indicated at 519. The collimated ion beam 520 exiting from the third multi-pole device 517 has a small beam profile, e.g., a spot beam profile, suitable as the ion beam B1 used in the first mode of operation of the ion implantation apparatus 200. In the second mode of the beam guide assembly 500 as illustrated in FIG. 5B, the second multi-pole device 515 is configured as a diverging lens to diverge the ion beam as indicated at 516. The collimated ion beam 518 exiting from the third multi-pole device 517 has a large beam profile, e.g., a ribbon beam profile, suitable as the ion beam B2 used in the second mode of operation of the ion implantation apparatus 200. In one or more embodiments, the second multi-pole device 515 is omitted or configured as a converging lens which converge the ion beam while keeping the beam profile in the ribbon shape for use in the second mode of operation of the ion implantation apparatus 200.

Figure 5C:
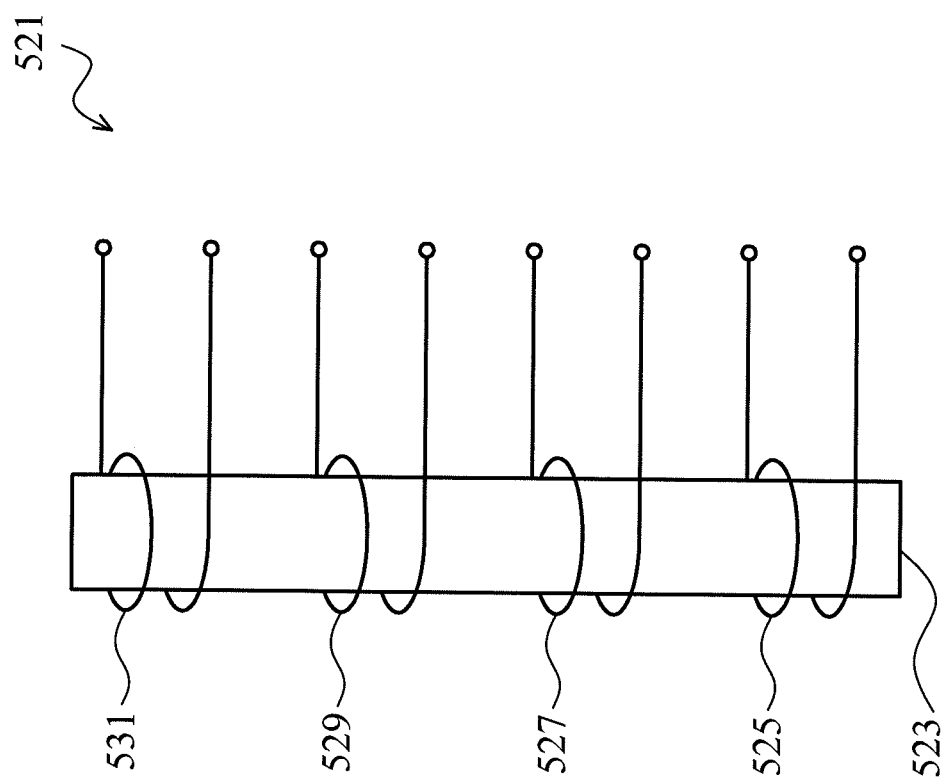
FIG. 5C is a schematic side view of a multi-pole electrode in accordance with some embodiments.

FIG. 5C is a schematic side view of a multi-pole electrode 521 in accordance with some embodiments. The multi-pole electrode 521 includes a core 523, and one or more coils 525, 527, 529, 531 wound around the core 523. Each coil 525, 527, 529, 531 is individually controlled by a separate voltage applied thereto. By varying voltages individually applied to the coils 525, 527, 529, 531, electromagnetic fields along the core 523 is locally variable. Several multi-pole electrodes similar to the multi-pole electrode 521 are arranged adjacent each other to define a multi-pole device. By varying physical arrangements among the multi-pole electrodes of a multi-pole device and/or varying control voltages applied individually to the coils of each multi-pole electrode, various functions and/or effects of the multi-pole devices described with respect to FIGS. 1-3 and 5A-5B are achievable.

In some embodiments, by providing an ion source, such as the ion source 450, with multiple arc chambers, beam current and/or beam energy of a generated ion beam is/are adjustable in a wide range. Depending on the beam current and/or beam energy of the generated ion beam, the ion beam is shaped to have an appropriate beam profile, e.g., a spot beam profile for a low current ion beam or a ribbon beam profile for a high current ion beam. As a result, ion beams of appropriate configurations are generated for use with the first and second modes of operation of the ion implantation apparatus 200. The manufacturing flexibility is enhanced whereas process control is simplified. In one or more embodiments, the ion implantation apparatus 200 is configured to process large wafers, e.g., 450 mm wafers.

Figure 6:
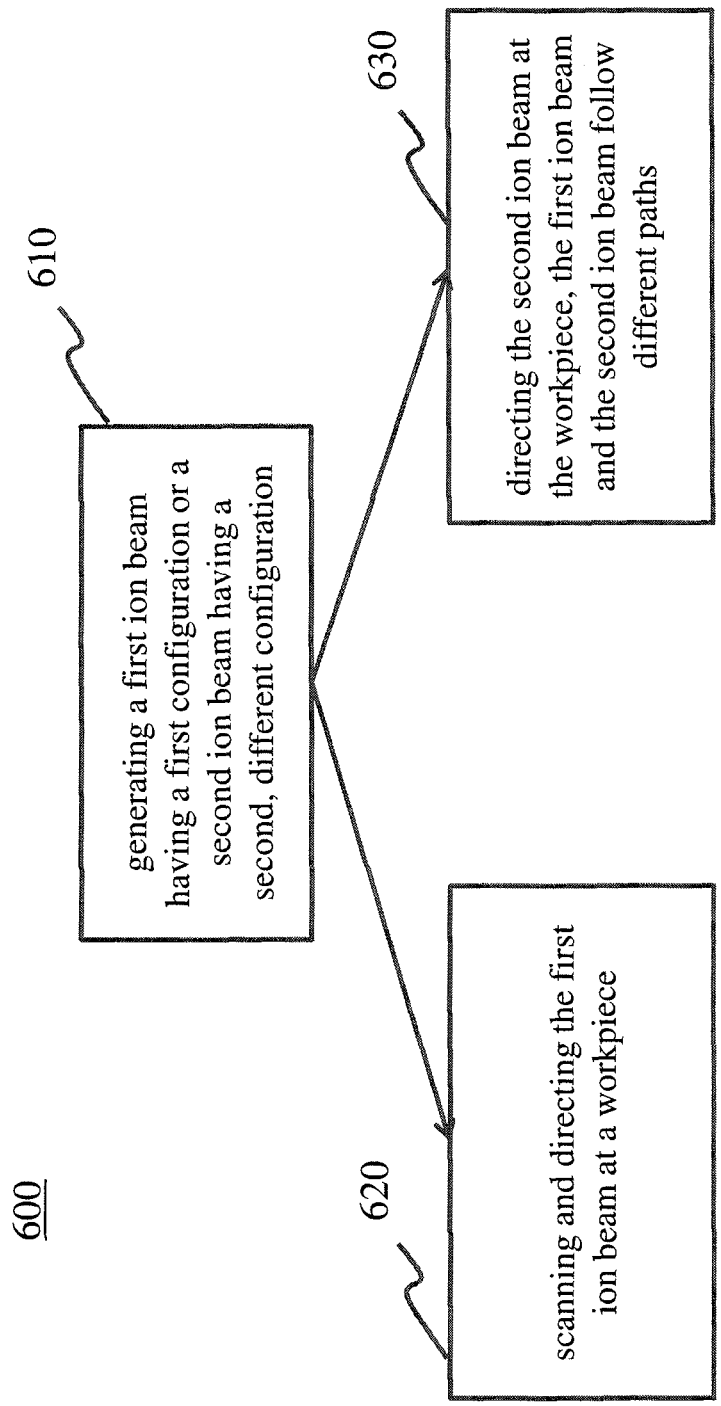
FIG. 6 is a flow chart of an ion implantation method in accordance with some embodiments.

FIG. 6 is a flow chart of an ion implantation method 600 in accordance with some embodiments. The method 600 is performed in at least one embodiment by the ion implantation apparatus 200.

At operation 610, a first ion beam having a first configuration or a second ion beam having a second, different configuration is generated. For example, as described with respect to FIGS. 2-3, an ion beam B1 or an ion beam B2 having a configuration different from the configuration of the ion beam B1 is generated. The method then proceeds to operation 620 or operation 630.

At operation 620, the first ion beam having the first configuration is scanned and then directed along a first path at a workpiece. For example, as described with respect to FIG. 2, when the ion beam B1 is generated, the ion beam B1 is scanned by the scanning device 220 in the Y direction, and the scanned ion beam is transmitted along the first path 291 at a workpiece 295.

At operation 630, the second ion beam having the second configuration is directed along a second, different path at the workpiece. For example, as described with respect to FIG. 3, when the ion beam B2 is generated, the ion beam B2 is transmitted along the second path 392 at the workpiece 295.

The above method(s) include(s) example operations, which are not necessarily required to be performed in the order shown and/or described. Operations may be added, replaced, changed order, and/or eliminated as appropriate, in accordance with the spirit and scope of embodiments of the disclosure. Embodiments that combine different features and/or different embodiments are within the scope of the disclosure and will be apparent to those of ordinary skill in the art after reviewing this disclosure. For example, although positively charged ions are discussed in the above description, negatively charged ions are usable for ion implantation in some embodiments.

According to some embodiments, a processing apparatus comprises an end station configured to support thereon a workpiece, an ion beam generator and a scanning device. The ion beam generator is configured to generate an ion beam toward the end station. The scanning device is configured to scan the ion beam in a transverse scanning direction. The scanning device is configured to be disposed in a first path of the ion beam toward the end station and out of a second path of the ion beam toward the end station.

According to some embodiments, an ion implantation apparatus comprises an end station configured to support thereon a workpiece to be ion implanted, an ion beam generator, a scanning device, a deceleration stage and an output multi-pole device. The ion beam generator is configured to generate an ion beam toward the end station. The ion beam has a first configuration or a second configuration different from the first configuration. The scanning device is located on a first path downstream of the ion beam generator, and configured to scan the ion beam having the first configuration and transmitted along the first path in a scanning direction transverse to the first path. The deceleration stage is located on a second path downstream of the ion beam generator, and configured to decelerate the ion beam having the second configuration and transmitted along the second path. The second path is partially deviated from the first path. The output multi-pole device is common to both the first path and the second path. The output multi-pole device is located on the first path between the scanning device and the end station, and on the second path between the ion beam generator and the end station. The output multi-pole device is configured to control uniformity of the ion beam before the ion beam reaches the workpiece supported at the end station.

According to some embodiments, an ion implantation method comprises generating a first ion beam or a second ion beam, the first ion beam having a different configuration from the second ion beam. The method further comprises either (i) scanning and directing the first ion beam at a workpiece to perform ion implantation on the workpiece, or (ii) directing the second ion beam at the workpiece to perform ion implantation on the workpiece. The first ion beam and the second ion beam follow different paths.

It will be readily seen by one of ordinary skill in the art that one or more of the disclosed embodiments fulfill one or more of the advantages set forth above. After reading the foregoing specification, one of ordinary skill will be able to affect various changes, substitutions of equivalents and various other embodiments as broadly disclosed herein. It is therefore intended that the protection granted hereon be limited only by the definition contained in the appended claims and equivalents thereof.

What is claimed is:

1. A processing apparatus, comprising:
   an end station configured to support thereon a workpiece;
   an ion beam generator configured to generate an ion beam toward the end station; and
   a scanning device configured to scan the ion beam in a transverse scanning direction;
   wherein the scanning device is configured to be disposed in a first path of the ion beam toward the end station and out of a second path of the ion beam toward the end station.

2. The processing apparatus of claim 1, further comprising:
   an output multi-pole device common to both the first path and the second path, the output multi-pole device located on the first path between the scanning device and the end station, and on the second path between the ion beam generator and the end station;
   wherein the output multi-pole device is configured to control uniformity of the ion beam before the ion beam reaches the workpiece supported at the end station.

3. The processing apparatus of claim 2, further comprising:
   a multi-pole device configured to control parallelism of the ion beam before the ion beam reaches the output multi-pole device.

4. The processing apparatus of claim 3, wherein the multi-pole device is a first intermediate multi-pole device located on the first path between the scanning device and the output multi-pole device.

5. The processing apparatus of claim 3, wherein the multi-pole device is a second intermediate multi-pole device located on the second path between the ion beam generator and the output multi-pole device.

6. The processing apparatus of claim 2, further comprising:
a deceleration stage disposed between the ion beam generator and the output multi-pole device, wherein
the deceleration stage is configured to linearly decelerate the ion beam in the first path or to deflect the ion beam in the second path.

7. The processing apparatus of claim 1, wherein the ion beam generator includes at least two arc chambers configured to operate individually or in combination to vary at least one of a beam current or beam energy of the ion beam.

8. The processing apparatus of claim 1, wherein the scanning device is physically moveable out of the second path.

9. An ion implantation apparatus, comprising:
an end station configured to support thereon a workpiece to be ion implanted;
an ion beam generator configured to generate an ion beam toward the end station, the ion beam having a first configuration or a second configuration different from the first configuration;
a scanning device located on a first path downstream of the ion beam generator and configured to scan the ion beam having the first configuration and transmitted along the first path in a scanning direction transverse to the first path;
a deceleration stage located on a second path downstream of the ion beam generator and configured to decelerate the ion beam having the second configuration and transmitted along the second path, the second path partially deviated from the first path; and
an output multi-pole device common to both the first path and the second path, the output multi-pole device located on the first path between the scanning device and the end station, and on the second path between the ion beam generator and the end station, the output multi-pole device configured to control uniformity of the ion beam before the ion beam reaches the workpiece supported at the end station.

10. The ion implantation apparatus of claim 9, further comprising:
a first intermediate multi-pole device located on the first path between the scanning device and the output multi-pole device, the first intermediate multi-pole device configured to control parallelism of the ion beam passing therethrough before the ion beam reaches the output multi-pole device.

11. The ion implantation apparatus of claim 10, further comprising:
a second intermediate multi-pole device located on the second path between the ion beam generator and the deceleration stage, the second multi-pole device configured to control parallelism of the ion beam passing therethrough before the ion beam reaches the output multi-pole device.

12. The ion implantation apparatus of claim 11, further comprising:
a vacuum chamber in which the ion beam generator, the scanning device, the first and second intermediate multi-pole device, the deceleration stage and the output multi-pole device are contained.

13. The ion implantation apparatus of claim 11, wherein the deceleration stage is further located on the first path between the scanning device and the output multi-pole device, the first path extending linearly through the deceleration stage, the second path having a bent section in the deceleration stage.

14. The ion implantation apparatus of claim 13, wherein the ion beam generator includes a dual ion source.

15. The ion implantation apparatus of claim 9, further comprising:
an actuator configured to physically move the scanning device out of the second path in response to the ion beam generator generating the ion beam having the second configuration along the second path.

16. An ion implantation apparatus, comprising:
an end station configured to support thereon a workpiece to be ion implanted;
an ion beam generator configured to
in a first mode, generate a first ion beam and output the generated first ion beam toward the end station, and
in a second mode, generate a second ion beam and output the generated second ion beam toward the end station, the second ion beam having a different configuration from the first ion beam; and
a scanning device configured to scan the first ion beam in the first mode, without scanning the second ion beam in the second mode, wherein the scanning device is disposed in a path of the first ion beam toward the end station and out of a path of the second ion beam toward the end station.

17. The ion implantation apparatus of claim 16, further comprising:
an intermediate stage arranged between the ion beam generator and the end station,
wherein the intermediate stage is configured to, in the first mode, accelerate the scanned first ion beam before the first ion beam reaches the end station.

18. The ion implantation apparatus of claim 17, wherein the intermediate stage is further configured to, in the second mode, decelerate the second ion beam before the second ion beam reaches the end station.

19. The ion implantation apparatus of claim 16, wherein the ion beam generator is configured to
in the first mode, generate the first ion beam having a spot beam profile, and
in the second mode, generate the second ion beam having a ribbon beam profile.

20. The ion implantation apparatus of claim 19, wherein the ion beam generator is configured to
in the first mode, generate the first ion beam to have a first beam current, and
in the second mode, generate the second ion beam to have a second beam current higher than the first beam current.

* * * * *